(12) United States Patent
Hayashi (10) Patent No.: US 9,633,969 B2
(45) Date of Patent: Apr. 25, 2017

(54) SEMICONDUCTOR DEVICE, SEMICONDUCTOR CHIP, AND METHOD OF MANUFACTURING SEMICONDUCTOR DEVICE

(71) Applicant: Kabushiki Kaisha Toshiba, Minato-ku, Tokyo (JP)

(72) Inventor: Sachio Hayashi, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/002,117

(22) Filed: Jan. 20, 2016

(65) Prior Publication Data
US 2017/0077060 A1    Mar. 16, 2017

(30) Foreign Application Priority Data

Sep. 11, 2015  (JP) .................. 2015-179386

(51) Int. Cl.
| | | |
|---|---|---|
| H01L 23/00 | (2006.01) |
| H01L 23/498 | (2006.01) |
| H01L 21/66 | (2006.01) |
| H01L 27/02 | (2006.01) |

(52) U.S. Cl.
CPC .............. *H01L 24/49* (2013.01); *H01L 22/20* (2013.01); *H01L 23/49838* (2013.01); *H01L 24/03* (2013.01); *H01L 24/09* (2013.01); *H01L 24/85* (2013.01); *H01L 27/0248* (2013.01);
(Continued)

(58) Field of Classification Search
CPC ... H01L 24/85; H01L 24/09; H01L 23/49838; H01L 24/49; H01L 22/20; H01L 24/03; H01L 27/0248; H01L 2224/48227; H01L 2224/04042; H01L 2824/1301
USPC ....... 257/773, 208, 211, 207, 691, 668, 696, 257/698
See application file for complete search history.

(56) References Cited

U.S. PATENT DOCUMENTS

| | | | |
|---|---|---|---|
| 5,283,717 A * | 2/1994 | Hundt | H01L 23/3107 174/255 |
| 6,985,034 B1 * | 1/2006 | Prokin | H02M 1/44 330/207 A |
| 2007/0205451 A1 | 9/2007 | Mizushino et al. | |

(Continued)

FOREIGN PATENT DOCUMENTS

| | | |
|---|---|---|
| JP | H08-274261 A | 10/1996 |
| JP | 2006-059961 A | 3/2006 |

(Continued)

*Primary Examiner* — Alexander Oscar Williams
(74) *Attorney, Agent, or Firm* — White & Case LLP (57) ABSTRACT

A semiconductor device includes a semiconductor chip including first to fourth pads, and first and second switches. The first switch includes first and second nodes coupled to the first and second pads and sends from the second node a current larger than a threshold flowing in from the first node. The second switch includes third and fourth nodes coupled to the third and fourth pads and sends from the fourth node a current larger than a threshold flowing in from the third node. The third and fourth nodes are not coupled to any nodes of high and low potentials of any circuit which receives the potentials to operate. A first wire is coupled to the first pad and the first conductor, and a second wire is coupled to the second pad and the second conductor.

12 Claims, 8 Drawing Sheets

(52) U.S. Cl.
CPC .......... *H01L 2224/04042* (2013.01); *H01L 2224/48227* (2013.01); *H01L 2924/1301* (2013.01)

(56) References Cited

U.S. PATENT DOCUMENTS

2010/0155614 A1* 6/2010 Yagi .................. G01T 1/00
   250/370.09
2011/0140730 A1* 6/2011 Zieren ................ G01R 31/048
   324/762.03

FOREIGN PATENT DOCUMENTS

| | | |
|---|---|---|
| JP | 2006-339439 A | 12/2006 |
| JP | 2011-009289 A | 1/2011 |
| JP | 2013-085272 A | 5/2013 |
| JP | 2013-165126 A | 8/2013 |

* cited by examiner

SEMICONDUCTOR DEVICE, SEMICONDUCTOR CHIP, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2015-179386, filed Sep. 11, 2015, the entire contents of which are incorporated herein by reference.

FIELD

Embodiments relate to a semiconductor device.

BACKGROUND

Semiconductor chips may be provided with a mechanism for protecting the inside thereof from static electricity unintentionally applied from the outside. Such mechanism includes electrostatic discharge (ESD) damage protection circuits, which may be simply referred to as protection circuits hereinafter. Each protection circuit conducts the current due to static electricity to flow through the protection circuit to prevent the current from flowing through circuits inside the semiconductor chip. The protection circuit needs to be provided to allow the semiconductor chip to have a required tolerance (a withstand voltage) against the static electricity.

DETAILED DESCRIPTION

According to one embodiment, a semiconductor device includes: a substrate; terminals on the substrate; a first conductive line and a second conductive line provided on the substrate and electrically coupled to the terminals; and a semiconductor chip on the substrate. The semiconductor chip includes: a circuit; first to fourth pads; and first and second switch elements. The first switch element includes a first node coupled to the first pad and the circuit, and a second node coupled to the second pad and the circuit, and sends out from the second node via the first switch element a current of a magnitude larger than a first threshold that flows in from the first node. The second switch element includes a third node coupled to the third pad, and a fourth node coupled to the fourth pad. The third node and the fourth node are not coupled to any node of a high potential or any node of a low potential of any circuit in the semiconductor chip which receives the high potential and the low potential to operate. The second switch element sends out from the fourth node via the second switch element a current of a magnitude larger than a second threshold that flows in from the third node. The semiconductor device includes a first wire coupled to the first pad and the first conductive line, and a second wire coupled to the second pad and the second conductive line.

Figure 1:
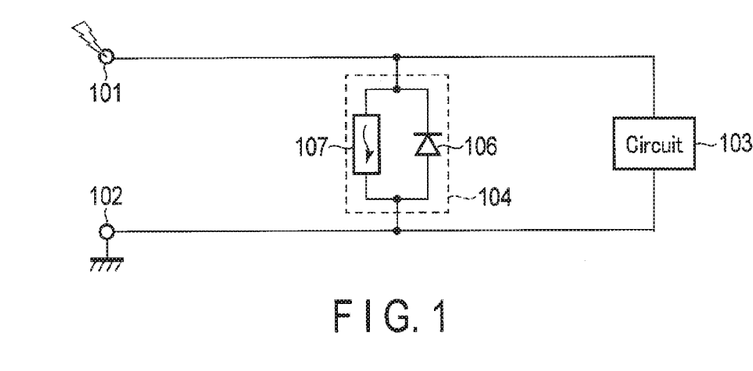
FIG. 1 illustrates a protection circuit for reference and an equivalent circuit of associated components.

FIG. 1 illustrates a protection circuit for reference and an equivalent circuit of associated components. A circuit 103 is provided between power supply terminals 101 and 102. A protection circuit 104 is also provided between the power supply terminals 101 and 102. The protection circuit 104 includes a diode 106 and a switch element 107, for example. If an excessive current flows into the protection circuit 104 from the terminal 101, the switch element 107 turns on to conduct the current flow through the switch element 107 into the terminal 102.

The protection circuit 104 is provided along with the circuit 103 in a semiconductor chip. Namely, the circuit 103 is implemented by the combination of components, such as diffusion layers in a substrate of the semiconductor chip, conductors and insulators above the substrate, and the protection circuit 104 is also implemented by the combination of those components. Therefore, in the stage of designing the semiconductor chip, the protection circuit 104 is designed to have an ability to provide a desired withstand voltage to the semiconductor chip, and then the semiconductor chip which includes the protection circuit 104 and the various circuits 103 as designed is produced.

The diffusion layers, conductors, and insulators in the semiconductor chip are formed through processes such as formation of an original material which will be a layer, processing of the formed material into a particular shape, and introduction of impurities. The formation of the layers and introduction of impurities require a mask for shaping the layers and controlling the introduction of the impurities to a particular area. As described above, the design of the protection circuit 104 is completed in the stage for designing the semiconductor chip. Therefore, the mask for manufacturing the semiconductor chip is produced to allow the protection circuit 104 as designed in the design stage of the semiconductor chip to be manufactured.

The manufactured semiconductor chip is tested to determine if it has a desired withstand voltage as designed. The protection circuit 104 of the manufactured semiconductor chip should have the performance to allow the semiconductor chip to have the desired withstand voltage. The protection circuit 104 may, however, not have the desired withstand voltage due to various factors of the manufacturing processes. In such a case, such a semiconductor chip is classified as defective, and the design of the semiconductor chip and manufacturing processes are reviewed. Depending on the result of the review, the layout of the semiconductor chip and/or the shape of a particular component may need to be adjusted. Producing the adjusted layout and the component with the adjusted shape may require adjustment of an associated mask. Such adjustment of the layout, the structural shape, and/or layout may require a lot of work and time.

Embodiments will now be described with reference to the figures. In the following description, components with substantially the same functionalities and configurations will be referred to with the same reference numeral, and repeated description may be omitted. The figures are schematic, and the relationship between the thickness and the area of a plane of a layer and the ratios of layer thicknesses may differ from the actual ones. An embodiment only illustrates devices and methods for materializing the technical idea of this embodiment, and the technical idea of the embodiments do not specify the quality of the material, form, structure, arrangement of components, etc. to the following. Any step in a flow of a method of an embodiment is not limited to any illustrated order, and can occur in an order different from an illustrated order and/or can occur concurrently with another step.

Figure 2:
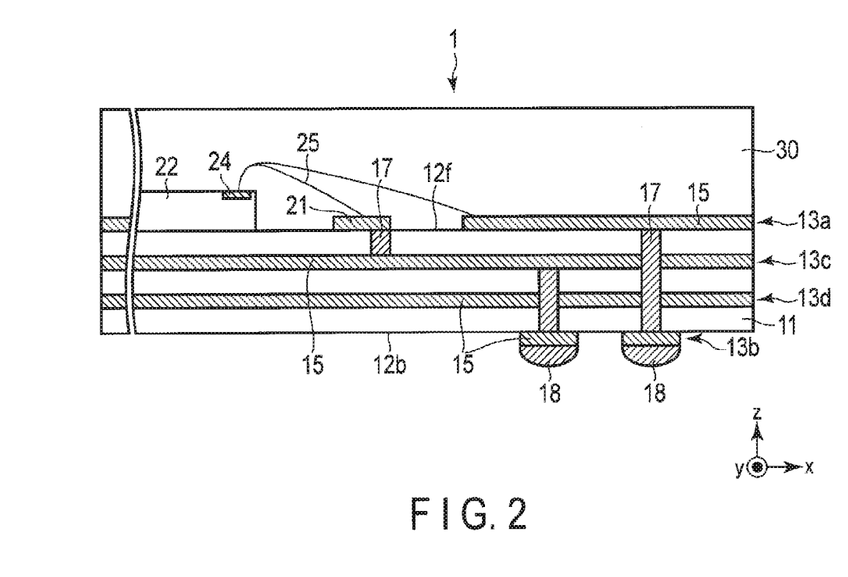
FIG. 2 illustrates a cross-section of a semiconductor device of one embodiment.

FIG. 2 illustrates a cross-section of a semiconductor device of one embodiment. As illustrated in FIG. 2, the semiconductor device 1 includes a substrate 11. The substrate 11 has, for example, a rectangular shape along the xy-plane, and includes two main surfaces which extend along the xy-plane. One of the main surfaces is referred to as a front surface 12$f$, and the other is referred to as a back surface 12$b$. The substrate 11 has at least two layers 13$a$ and 13$b$, or, for example, four layers 13$a$, 13$b$, 13$c$, and 13$d$. The layer 13$a$ is located on the front surface 12$f$, and the layer 13$b$ is located on the back surface 12$b$. The layers 13$c$ and 13$d$ are located inside the substrate 11. The layers 13$a$, 13$b$, 13$c$, and 13$d$ are separate from each other.

The layers 13$a$, 13$b$, 13$c$, and 13$d$ are provided with interconnects 15. The interconnects 15 have plural linear patterns with widths in the xy-plane, and/or extend as a shape of a plate along the xy-plane. The interconnects 15 along the z-axis of adjacent layers of the layers 13$a$, 13$b$, 13$c$, and 13$d$ are coupled by conductive via plugs 17 in various positions. The interconnects 15 of the layer 13$b$ are provided with terminals 18 thereon.

Figure 3:
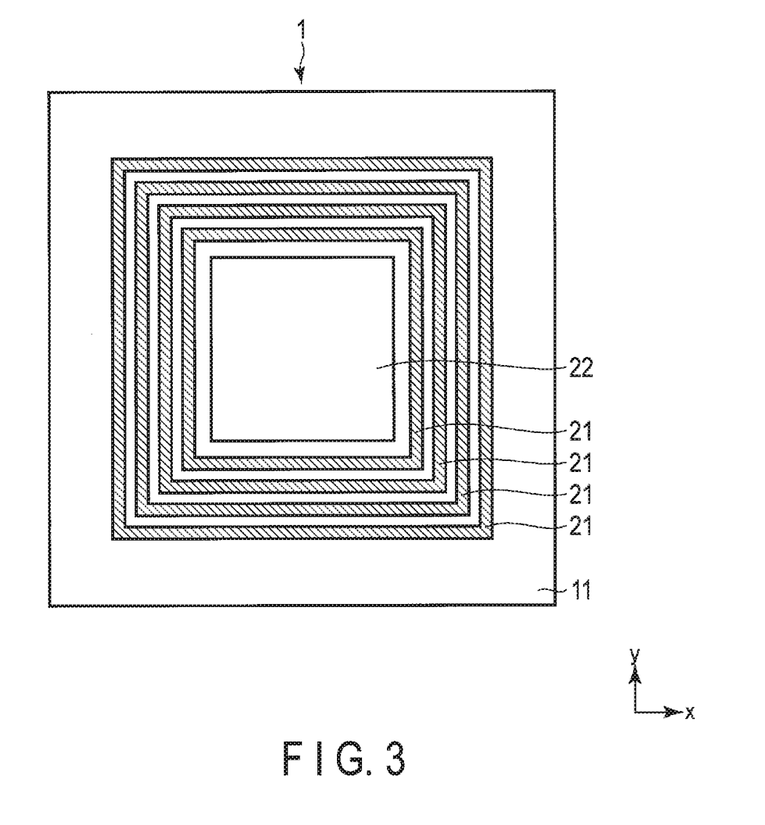
FIG. 3 is a plan view of the semiconductor device of one embodiment.

The layer 13$a$ is further provided with conductive rings (or, conductive lines) 21 thereon. Although FIG. 2 illustrates only one ring 21 for the purpose of clarification of the figure, plural rings 21 are provided as illustrated in FIG. 3. Each ring 21 has the shape of a line with a width along the xy-plane, and surrounds another ring along the xy-plane. The rings 21 may have one or more openings. The innermost ring 21 surrounds a particular area of the front surface 12$f$ of the substrate 11. The surrounded area is, for example, the center of front surface 12$f$.

Referring back to FIG. 2, the rings 21 are coupled to the interconnects 15 in the layer 13$c$ by the via plugs 17. The rings 21 are provided for the purpose of, for example, providing supply potentials supplied from outside the semiconductor device 1 to a wide range over the semiconductor device 1 through low-resistance interconnects. The supply potentials include a power potential (VDD) and ground potential (VSS). The rings 21 are electrically coupled to the terminals 18 for the power supplies through the via plugs 17 and the interconnects 15. The rings 21 for power potential are electrically coupled to a terminal 18 for power potential. The terminal 18 for power potential is coupled to a terminal which supplies the power potential outside the semiconductor device 1, and it receives the power potential from such a supplying terminal while the semiconductor device 1 is operating. The terminal 18 for ground potential is coupled to a terminal which supplies the ground potential outside the semiconductor device 1, and it receives the ground potential from such a supplying terminal while the semiconductor device 1 is operating.

The semiconductor device 1 has a semiconductor chip 22 on the front surface 12$f$ of the substrate 11 in the area surrounded by the innermost ring 21. The semiconductor chip 22 includes diffusion layers, conductors, and insulators above and in the surface of a substrate (separate substrate from the substrate 11) of, for example, silicon. The combination of the diffusion layers, the conductors, and the insulators can implement various electrical elements and interconnects and via plugs which couple various components to each other.

The semiconductor chip 22 has conductive pads 24 in an area near an edge on the surface opposite the substrate 11. The pads 24 are electrically coupled to a circuit (or, a circuit 27 to be described later) inside the semiconductor chip 22. The circuit may be of any type. A particular pad 24 and a particular ring 21 are coupled by a conductive wire 25. The wires 25 are provided by bonding. Another pad 24 is coupled to a particular interconnect 15 on the front surface 12$f$ of the substrate 11 by a wire 25.

The front surface 12$f$ of the substrate 11 is sealed by sealing member 30 of, for example, resin.

Figure 4:
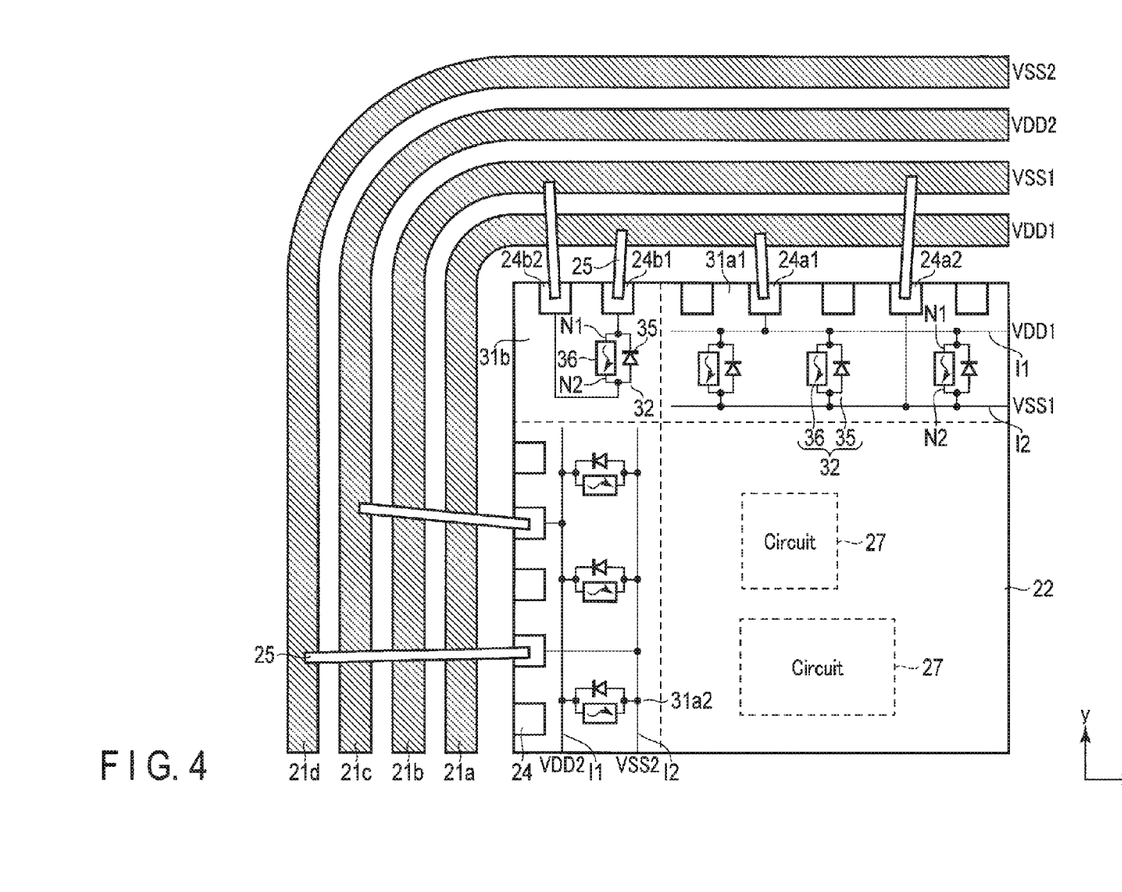
FIG. 4 illustrates part of some components of the semiconductor device of one embodiment.

FIG. 4 illustrates part of some components of the semiconductor device 1 along the xy-plane, and it specifically illustrates the view of some components in an area of a corner of the semiconductor chip 22 and the periphery thereof when seen from above along the z-axis.

As illustrated in FIG. 4, the rings 21 include the rings 21$a$, 21$b$, 21$c$, and 21$d$. The ring 21$a$ has a power potential VDD1, and the ring 21$b$ has a ground potential VSS1. The potentials VDD1 and VSS1 make a pair, and, similarly, the rings 21$a$ and 21$b$ make a pair. The ring 21$c$ has a power potential VDD2, and the ring 21$d$ has a ground potential VSS2. The potentials VDD2 and VSS2 make a pair, and, similarly, the rings 21$c$ and 21$d$ make a pair. Plural pairs of supply potentials (i.e., power and ground potentials) are provided to supply potentials in a separate system, for example. The power potential VDD and/or the ground potential VSS of a particular supply potential pair may be the same as or different from the power potential VDD and/or the ground potential VSS of another supply potential pair, respectively. The arrangement of the rings 21$a$, 21$b$, 21$c$, and 21$d$ is not limited to the example of FIG. 4.

The semiconductor device 1 may receive plural supply potential pairs. Thus, a pair of rings 21 is provided in order to transmit, among plural supply potential pairs, at least a supply potential pair which is transmitted by interconnects with a low resistance and/or which needs to be distributed widely over the semiconductor chip 22.

The semiconductor chip 22 has plural ESD protection circuits 31$a$ (31$a$1 and 31$a$2) in an area of an edge. The protection circuit 31$a$ includes pads 24 (24$a$1 and 24$a$2), two independent interconnects I1 and I2, and protection element 32. Each protection circuit 31$a$ is associated with one supply potential pair, and provides protection for the associated supply potential pair. Specifically, in each protection circuit 31$a$, interconnect I1 thereof is coupled to one ring 21 among one ring-pair through a pad 24 and a wire 25, and the interconnect I2 is coupled to the other ring 21 through a pad 24 and a wire 25. In FIG. 4, the interconnect I1 of the protection circuit 31$a$1 is coupled to the ring 21$a$ through a pad 24$a$1, and has the power potential VDD1 while the semiconductor device 1 is operating. In contrast, the interconnect I2 of the protection circuit 31$a$1 is coupled to the ring 21$b$ through a pad 24$a$2, and has the ground potential VSS1 while the semiconductor device 1 is operating.

Furthermore, the interconnect I1 of the protection circuit 31$a$2 is coupled to the ring 21$c$, and has the power potential VDD2 while the semiconductor device 1 is operating. In contrast, the interconnect I2 of the protection circuit 31$a$2 is coupled to the ring 21*d*, and has the ground potential VSS2 while the semiconductor device 1 is operating.

The interconnects I1 and I2 are coupled to the circuits 27 of the semiconductor chip 22, and transmit supply potentials (VDD1, VSS1, VDD2, and VSS2) to the coupled circuits 27. The interconnects I1 and I2 are implemented by interconnects of the semiconductor chip 22.

The set of the conductive components for transmitting a particular supply potential to the circuit 27 in the semiconductor chip 22, i.e., a terminal 18, interconnects 15 and via plugs 17 in the substrate 11, and interconnects I1 and I2, a pad 24 and a wire 25 in the semiconductor chip 22, make a power net. A power net includes a set of components for transmitting a particular potential. Two power nets for a particular supply potential pair make a pair.

One power net pair (in other words, a ring pair) may be provided with two or more protection circuits 31*a*.

In each protection circuit 31*a*, a protection element 32 is coupled between the interconnects I1 and I2. The protection element 32 includes a diode 35 and a switch element 36. The diode 35 is coupled to the interconnect I1 at the cathode, and to the interconnect I2 at the anode. The switch element 36 has nodes N1 and N2. The node N1 is coupled to the cathode of the diode 35 and the interconnect I1, and the node N2 is coupled to the anode of the diode 35 and the interconnect I2. The switch element 36 prevents the current which flows into the switch element 36 from the node N2, and does not allow the same to flow to the node N1. The switch element 36 remains off while the magnitude of a current which flows into the switch element 36 from the node N1 is smaller than a particular threshold, and keeps the current flowing in from the node N1 from reaching the node N2. In contrast, the switch element 36 turns on when the magnitude of a current which flows into the switch element 36 from the node N1 exceeds the threshold, and it outputs the current flowing in from the node N1. The switch element 36 is a thyristor, for example.

The semiconductor chip 22 has one or more ESD protection circuits 31*b* in an area of an edge. FIG. 4 illustrates only one protection circuit 31*b*. Each protection circuit 31*b* includes pads 24 (24*b*1 and 24*b*2) and a protection element 32, and is a spare. In each spare protection circuit 31*b*, the cathode of the diode 35 of the protection element 32 and the node N1 of the switch element 36 are coupled to the pad 24*b*1 of that spare protection circuit 31*b*. The connection between the cathode of the diode 35 and the node N1 of the switch element 36 of the protection element 32, and the pad 24*b*1 is implemented by interconnects of the semiconductor chip 22. Moreover, in each spare protection circuit 31*b*, the anode of the diode 35 and the node N2 of the switch element 36 of the protection element 32 are coupled to the pad 24*b*2 of that spare protection circuit 31*b*. The connection between the anode of the diode 35 and the node N2 of the switch element 36 of the protection element 32, and the pad 24*b*2 is implemented by interconnects of the semiconductor chip 22.

The cathode of the diode 35 and the node N1 of the switch element 36 of the spare protection circuit 31*b* are not coupled to a circuit of the semiconductor chip 22, nor coupled to any components other than the pad 24*b*1. Similarly, the anode of the diode 35 and the node N2 of the switch element 36 of the spare protection circuit 31*b* are not coupled to a circuit of the semiconductor chip 22, nor coupled to any components other than the pad 24*b*2. Specifically, the nodes N1 and N2 of the switch element 36 are not coupled to any circuit using the power potential and the ground potential to operate in the semiconductor chip 22. More specifically, the node N1 of the switch element 36 is not coupled to the power potential node of any circuit using the power potential and the ground potential to operate in the semiconductor chip 22. Also, the node N2 of the switch element 36 is not coupled to the ground potential node of any circuit using the power potential and the ground potential to operate in the semiconductor chip 22.

Each spare protection circuit 31*b* may or may not have the pads 24*b*1 and 24*b*2 thereof coupled to one of the rings 21 (21*a*, 21*b*, 21*c*, and 21*d*) through the wires 25. Specifically, in a particular semiconductor device 1, one or more spare protection circuits 31*b* are coupled to one of the rings 21, and the remaining one or more spare protection circuits 31*b* are coupled to no rings 21. In another semiconductor device 1, no spare protection circuit 31*b* is coupled to the rings 21. In still another semiconductor device 1, any spare protection circuit 31*b* is coupled to ones of the rings 21. The determination on which one or ones of the spare protection circuits 31*b* are coupled in a particular semiconductor device 1 is described in detail later.

Figure 5:
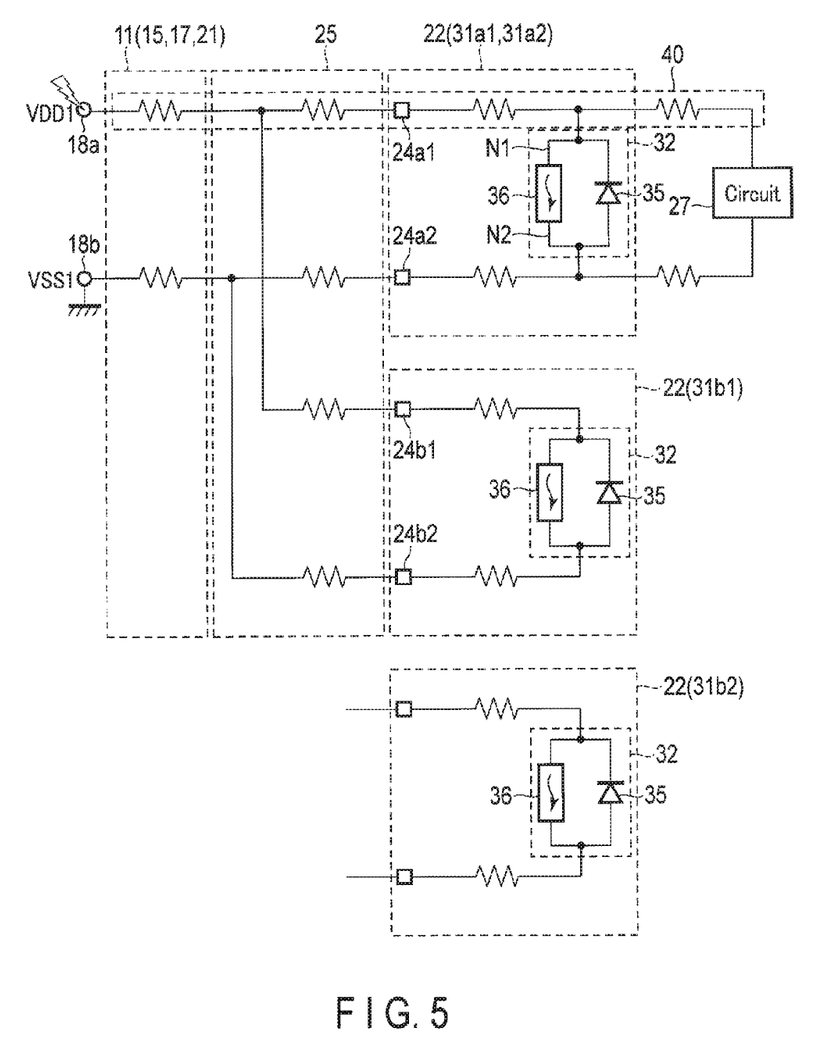
FIG. 5 illustrates an equivalent circuit of part of the semiconductor device of one embodiment.

FIG. 5 illustrates an equivalent circuit diagram of part of the semiconductor device 1. As illustrated in FIG. 5, a terminal 18*a* which receives the power potential VDD1 and a terminal 18*b* which receives the ground potential VSS are electrically coupled to the protection element 32 of the protection circuit 31*a*1. The set of the interconnect 15, the via plugs 17, the ring 21, the wire 25, and the interconnects in the semiconductor chip 22 for electrical connection of terminals 18*a* and 18*b* and the protection element 32 corresponds to one power net 40. The power net 40 has resistance components. The resistance components are represented by signs of the resistance elements in FIG. 5.

The terminals 18*a* and 18*b* are also coupled to a particular circuit 27. The circuit 27 receives the potentials VDD1 and VSS1 through the terminals 18*a* and 18*b*, and operates with the potentials VDD1 and VSS1. The circuit 27 is a target to be protected from electrostatic discharge damage by the protection circuit 31*a*1.

The terminals 18*a* and 18*b* are further electrically coupled to the protection element 32 of a spare protection circuit 31*b* (31*b*1). The resistance components of the electrical component for electrical connection between the terminals 18*a* and 18*b* and the protection element 32 are also illustrated in FIG. 5. In contrast, another spare protection circuit 31*b* (31*b*2) is not coupled to any terminals including the terminals 18*a* and 18*b*.

Thus, the two protection circuits 31*a*1 and 31*b*1 are coupled in parallel between the terminals 18*a* and 18*b*. As a result, when static electricity is applied to the terminal 18*a*, the current produced by this static electricity divides and flows into the two protection circuits 31*a*1 and 31*b*1. Therefore, the voltage applied to the circuit 27 is smaller than the case of only the protection circuit 31*a*1.

Figure 6:
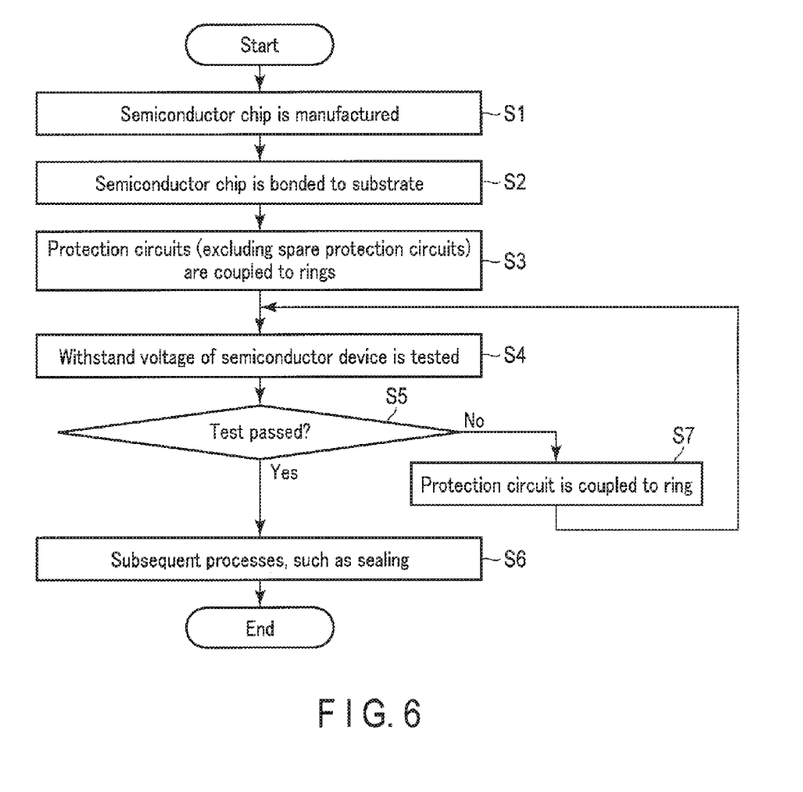
FIG. 6 illustrates the flow of a method for manufacturing the semiconductor device of one embodiment.

Referring to FIG. 6, a method of manufacturing the semiconductor device 1 will now be described. FIG. 6 illustrates the flow of the manufacturing method of the semiconductor device 1 of one embodiment. As illustrated in FIG. 6, the semiconductor chip 22 is manufactured (step S1).

In step S2, the semiconductor chip 22 is bonded to the substrate 11. In step S3, the pads 24 of the protection circuit 31*a* are coupled to the corresponding rings 21 through bonding wires. In step S3, no spare protection circuits 31*b* are coupled to the rings 21.

In step S4, the semiconductor device 1 under manufacture obtained up to step S3 is tested for the withstand voltage thereof. The examination is performed in units of power net pairs. Specifically, it is determined whether the withstand voltage between the terminal 18 of the potential VDD1 and the terminal 18 of the potential VSS1 is higher than a desired value. Similarly, the withstand voltage between the terminal 18 of the potential VDD2 and the terminal 18 of the potential VSS2, and the withstand voltage between the terminal 18 of a power potential and the terminal 18 of a ground potential which make a further pair, and so on, are examined one after another. The protection circuits 31a are designed to allow the semiconductor chip 22 coupled to the rings 21 to have a desired withstand voltage. For this reason, if manufactured as designed, the semiconductor device 1 should have the desired withstand voltages for any pair of terminals 18.

If the semiconductor device 1 passes the withstand voltage test in step S5, subsequent processes, such as sealing, are performed to result in completion of the semiconductor device 1 (step S6).

In contrast, if the semiconductor device 1 does not pass the test in step S5, the flow shifts to step S7. In step S7, the power net pair which does not have a desired withstand voltage is identified, and the spare protection circuit 31b is coupled to the identified power net pair (ring 21). For example, when the power net for the potentials VDD1 and VSS1 fails the test, the pad 24b1 of a spare protection circuit 31b is coupled to the ring 21a by a wire 25, and the pad 24b2 of that spare protection circuit 31b is coupled to the ring 21b by a wire 25. Furthermore, when another failed power net pair is found, the pair of the rings 21 included in the found power net pair is similarly coupled to the pads 24b1 and 24b2 of another spare protection circuit 31b.

Step S7 continues at step S4, and the test is again performed in step S4. Thus, according to one embodiment, the semiconductor chip 22 includes spare protection circuits 31b which are not coupled to the circuit 27, and a particular spare protection circuit 31b is coupled to a particular ring 21 with the wire 25. When a particular power net pair is determined as not having a desired withstand voltage with the original protection circuit 31a after the semiconductor chip 22 and the substrate 11 are coupled, a spare protection circuit 31b is coupled to the ring 21 of that power net pair. This can increase the withstand voltage of the power net pair determined as not having a desired withstand voltage to allow the power net pair to have a desired withstand voltage.

The spare protection circuits 31b can be coupled to the rings 21 by the wires 25, which are applied through bonding. For this reason, the withstand voltage of the semiconductor chip 22 can be readily improved even after the semiconductor chip 22 is manufactured. It is not necessary to redesign the semiconductor chip 22 in order to increase the withstand voltage.

Moreover, the spare protection circuits 31b are not coupled to any circuits 27. For this reason, they can be coupled to any power net pair.

(Modifications)

Figure 7:
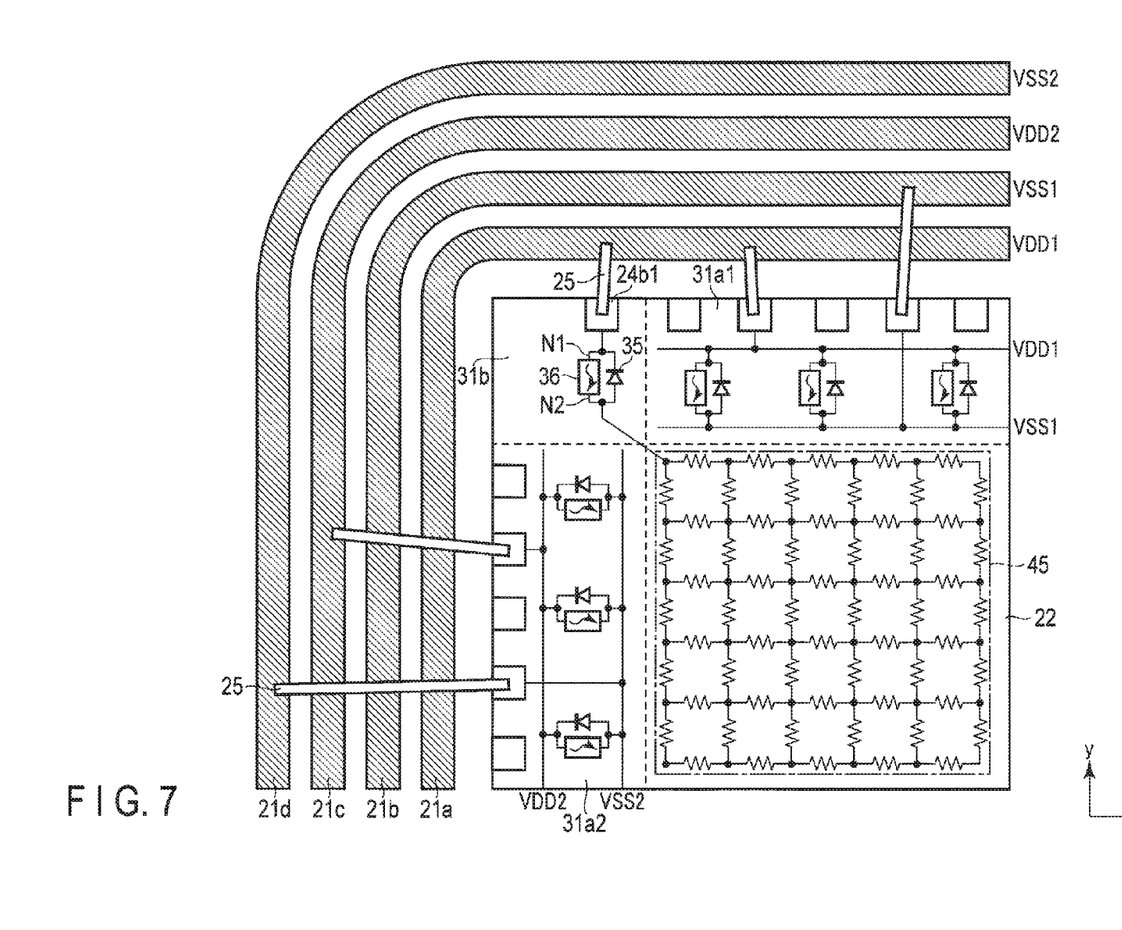
FIG. 7 illustrates part of some components of a semiconductor device of a first modification of one embodiment.

The description has been given of an example in which each spare protection circuit 31b has two pads 24. A spare protection circuit 31b, however, may have only one pad 24 (24b1), as illustrated in FIG. 7. In this case, the single pad 24b1 is coupled to the cathode of the diode 35 and the node N1 of the switch element 36. The pad 24b1 is coupled to, among the two rings 21 of a power net pair for which the spare protection circuit 31b provides the protection, the one for the power potential (for example, ring 21a) with the wire 25. The anode of the diode 35 and the node N2 of the switch element 36 are coupled to a main ground potential network 45 in the semiconductor chip 22. The network 45 includes plural interconnects or has a plate shape, and distributes the ground potential to a large area of the semiconductor chip 22 (for example, the entire semiconductor chip 22 along the xy-plane). Thus, the network 45 distributes, among plural ground potentials (VSS1, VSS2, . . . ), one which is used by main and/or most parts in the semiconductor chip 22. This modification can reduce the number of the pads of the spare protection circuits 31b and the number of the wires 25 for connection of the spare protection circuits 31b.

Figure 8:
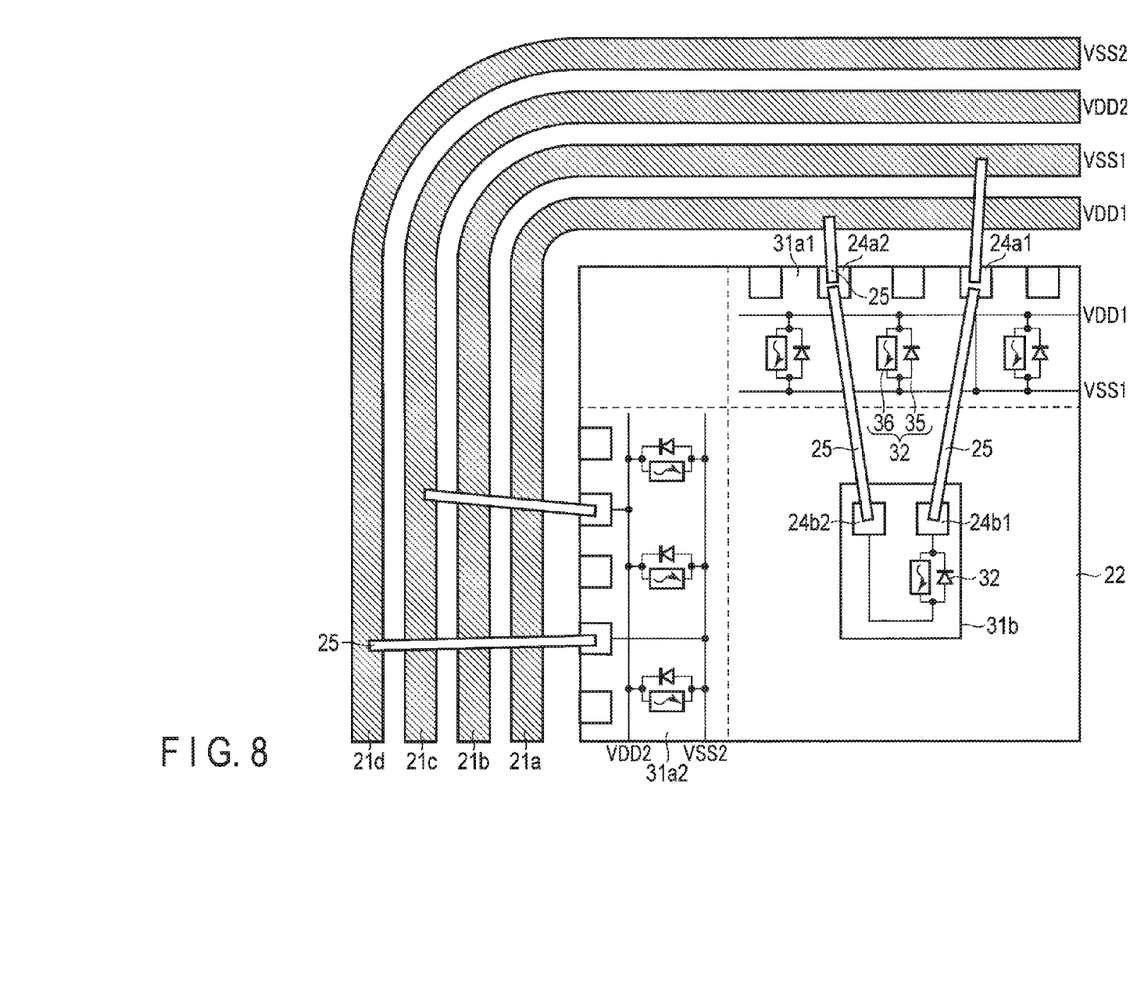
FIG. 8 illustrates part of some components of a semiconductor device of a second modification of one embodiment.

The description has also been given of an example where the spare protection circuits 31b are positioned in an area of an edge of the semiconductor chip 22. However, as illustrated in FIG. 8, one or more spare protection circuits 31b may be provided inside the semiconductor chip 22, or in areas other than a near-edge area thereof, specifically in an area nearer the center of the semiconductor chip 22 than the protection circuits 31a (31a1, 31a2). In this case, the pads 24b1 and 24b2 of a spare protection circuit 31b are coupled to the pads 24 of a protection circuit 31a already coupled to the power net pair which the spare protection circuit 31b protects (for example, the protection circuit 31a1) by the wires 25. Specifically, the pad 24b1 of the spare protection circuit 31b is coupled to the pad 24a1 of the protection circuit 31a, and the pad 24b2 of the spare protection circuit 31b is coupled to the pad 24a2 of the protection circuit 31a.

Figure 9:
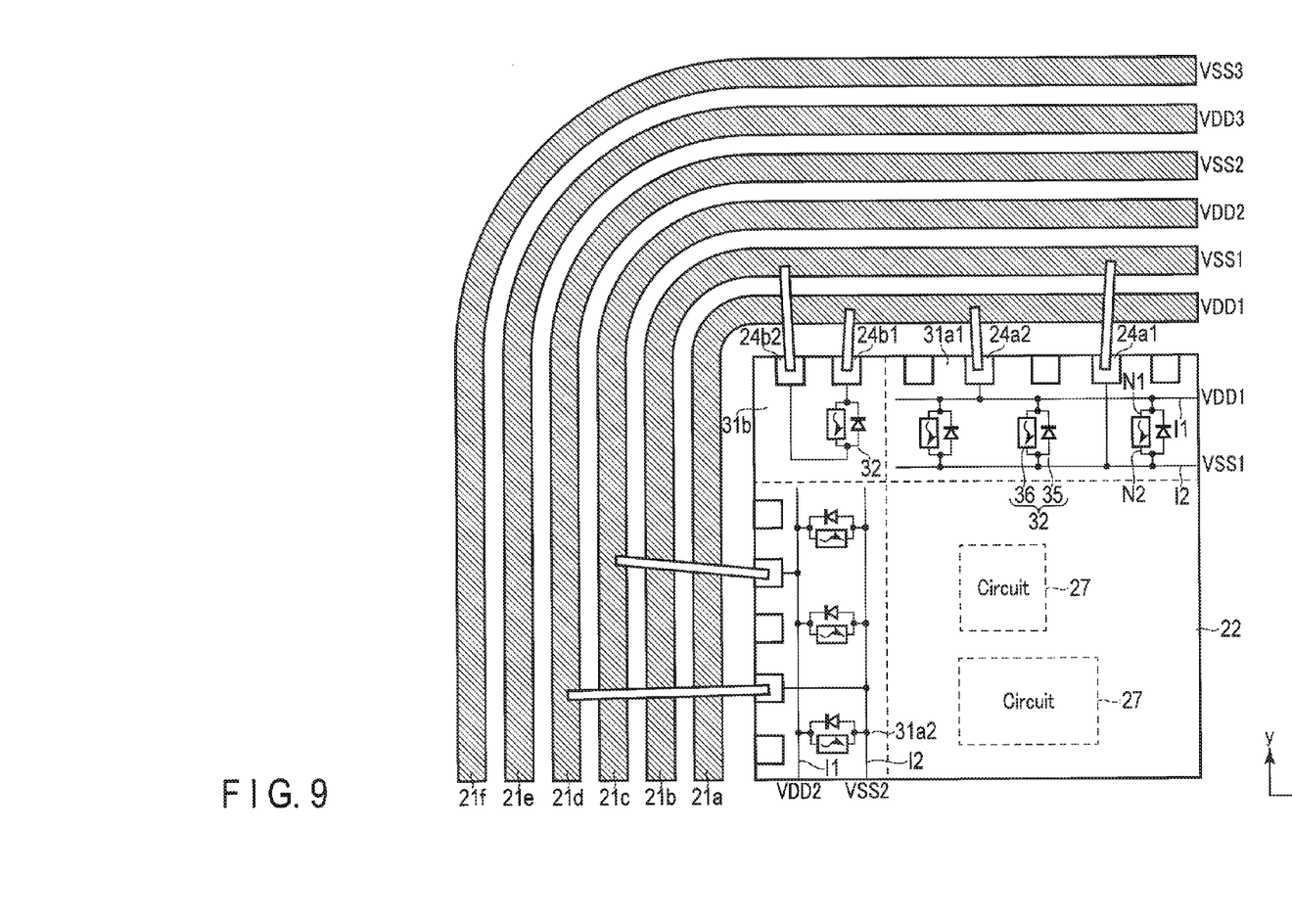
FIG. 9 illustrates part of some components of a semiconductor device of a third modification of one embodiment.

Furthermore, the example where the sets of the rings 21 are provided only to some of the plural supply potential pairs is described above. However, as illustrated in FIG. 9, the rings 21 may be provided to all of the supply potential pairs of the semiconductor device 1. FIG. 9 illustrates only a ring 21e for a power potential VDD3 and a ring 21f for a ground potential VSS3 in addition to the illustration of FIG. 4, as an example. This allows any power net pair to receive additional protection by the spare protection circuits 31b.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   terminals on the substrate;
   a first conductive line and a second conductive line provided on the substrate and electrically coupled to the terminals; and
   a semiconductor chip on the substrate comprising
      a circuit,
      a first pad and a second pad,
      a first switch element including a first node coupled to the first pad and the circuit and a second node coupled to the second pad and the circuit, and sending out from the second node via the first switch element a current of a magnitude larger than a first threshold that flows in from the first node,
      a third pad and a fourth pad, and
      a second switch element including a third node coupled to the third pad, a fourth node coupled to the fourth pad, the third node and the fourth node not coupled to any node of a high potential or any node of a low potential of any circuit in the semiconductor chip which receives the high potential and the low potential to operate, and sending out from the fourth node via a second switch element a current of a magnitude larger than a second threshold that flows in from the third node;
a first wire coupled to the first pad and the first conductive line; and
a second wire coupled to the second pad and the second conductive line.

2. The device of claim 1, wherein:
the first conductive line receives a potential higher than a potential of the second conductive line.

3. The device of claim 2, wherein:
the first node of the first switch element is coupled to a first potential node of the circuit, and
the second node of the first switch element is coupled to a second potential node of a potential lower than a potential of the first potential node of the circuit.

4. The device of claim 1, wherein:
the third pad and the first conductive line are coupled by a wire, and
the fourth pad and the second conductive line are coupled by a wire.

5. The device of claim 1, wherein:
the third pad and the first pad are coupled by a wire, and the fourth pad and the second pad are coupled by a wire.

6. The device of claim 2, wherein:
the first conductive line and the second conductive line make a first conductive line pair,
the device further comprises a second to $n^{th}$ conductive line pairs,
each of the first to $n^{th}$ conductive line pairs includes a power potential line receiving a power potential and a ground potential line receiving a ground potential,
n is equal to a number of independent potential pairs received by the semiconductor chip, and
each of the potential pairs includes a power potential and a ground potential.

7. The device of claim 1, wherein:
the first conductive line and the second conductive line completely or partially surround a circumference of the semiconductor chip.

8. A semiconductor chip comprising:
a circuit;
a first pad and a second pad;
a first switch element including a first node coupled to the first pad and the circuit, a second node coupled to the second pad and the circuit, and sending out from the second node via a first switch element a current of a magnitude larger than a first threshold that flows in from the first node;
a third pad and a fourth pad; and
a second switch element including a third node coupled to the third pad and a fourth node coupled to the fourth pad, the third node and the fourth node not coupled to any node of a high potential or any node of a low potential of any circuit in the semiconductor chip which receives the high potential and the low potential to operate, and sending out from the fourth node via the second switch element a current of a magnitude larger than a second threshold that flows in from the third node.

9. The chip of claim 8, wherein:
the first node of the first switch element is coupled to a first potential node of the circuit, and
the second node of the first switch element is coupled to a second potential node of a potential lower than a potential of the first potential node of the circuit.

10. A method of manufacturing a semiconductor chip comprising:
forming a semiconductor chip comprising
a first pad and a second pad,
a first switch element including a first node coupled to the first pad and a second node coupled to the second pad, the first node and the second node not coupled to any node of a high potential or any node of a low potential of any circuit in the semiconductor chip which receives the high potential and the low potential to operate, and sending out from the second node via the first switch element a current of a magnitude larger than a first threshold that flows in from the first node;
placing the semiconductor chip on a substrate which comprises terminals and a first conductive line and a second conductive line which are electrically coupled to the terminals;
after the placing, testing a withstand voltage of the semiconductor chip; and
when the withstand voltage of the semiconductor chip does not reach a magnitude in the testing, coupling the first pad and the first conductive line by a wire and coupling the second pad and the second conductive line by a wire.

11. The method of claim 10, wherein:
the semiconductor further comprises
a third pad and a fourth pad,
a second switch element including a third node coupled to the third pad and the circuit and a fourth node coupled to the fourth pad and the circuit, and sending out from the fourth node via the second switch element a current of a magnitude larger than a second threshold that flows in from the third node, and
the method further comprises, prior to the testing, coupling the third pad and the first conductive line by a wire and coupling the fourth pad and the second conductive line by a wire.

12. The method of claim 11, wherein:
the third node of the second switch element is coupled to a first potential node of the circuit, and
the fourth node of the second switch element is coupled to a second potential node of a potential lower than a potential of the first potential node of the circuit.

* * * * *